United States Patent
Song et al.

(10) Patent No.: US 11,430,759 B2
(45) Date of Patent: Aug. 30, 2022

(54) DISPLAY DEVICE INCORPORATING SELF-ASSEMBLED MONOLAYER AND METHOD OF MANUFACTURING THE SAME

(71) Applicant: Samsung Display Co., LTD., Yongin-si (KR)

(72) Inventors: Dae Ho Song, Yongin-si (KR); Min Woo Kim, Yongin-si (KR); Byung Choon Yang, Yongin-si (KR); Hyung Il Jeon, Yongin-si (KR); Jin Woo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 17/028,365

(22) Filed: Sep. 22, 2020

(65) Prior Publication Data

US 2021/0111142 A1 Apr. 15, 2021

(30) Foreign Application Priority Data

Oct. 15, 2019 (KR) .......................... 10-2019-0128023

(51) Int. Cl.
*H01L 23/00* (2006.01)
*H01L 25/16* (2006.01)

(52) U.S. Cl.
CPC .............. *H01L 24/32* (2013.01); *H01L 24/05* (2013.01); *H01L 24/83* (2013.01); *H01L 25/167* (2013.01); *H01L 2224/04026* (2013.01); *H01L 2224/05644* (2013.01); *H01L 2224/05647* (2013.01);

(Continued)

(58) Field of Classification Search
CPC ......... H01L 24/32; H01L 24/05; H01L 24/83; H01L 25/167; H01L 2224/04026; H01L 2224/05644; H01L 2224/05647; H01L 2224/32013; H01L 2224/32145;

(Continued)

(56) References Cited

U.S. PATENT DOCUMENTS 7,462,861 B2    12/2008 Slater, Jr. et al.
8,829,494 B2 *   9/2014 Halls .................... C08G 61/126
                                                              257/40
9,343,448 B2     5/2016 Sakariya et al.

(Continued)

FOREIGN PATENT DOCUMENTS

KR    10-0654682    12/2006
KR    10-1130151     3/2012

(Continued)

*Primary Examiner* — Mamadou L Diallo
(74) *Attorney, Agent, or Firm* — Kile Park Reed & Houtteman PLLC

(57) ABSTRACT

A display device and a method of manufacturing the same are provided. The display device includes a first electrode disposed on a substrate, an adhesive auxiliary layer disposed on the first electrode and including a self-assembled monolayer, a light emitting element disposed on the adhesive auxiliary layer, and a contact electrode disposed between the adhesive auxiliary layer and the light emitting element. The light emitting element includes a first semiconductor layer, a second semiconductor layer disposed on the first semiconductor layer, and an intermediate layer disposed between the first semiconductor layer and the second semiconductor layer.

23 Claims, 7 Drawing Sheets

(52) U.S. Cl.
CPC ............... *H01L 2224/32013* (2013.01); *H01L 2224/32145* (2013.01); *H01L 2224/32505* (2013.01)

(58) Field of Classification Search
CPC ......... H01L 2224/32505; H01L 27/156; H01L 33/005; H01L 33/36; H01L 33/52
See application file for complete search history.

(56) References Cited

U.S. PATENT DOCUMENTS

| | | |
|---|---|---|
| 10,410,998 B2 | 9/2019 | Kim et al. |
| 2007/0102699 A1* | 5/2007 | Lee ................... H01L 51/105 257/40 |
| 2008/0038867 A1* | 2/2008 | Shin ................... H01L 51/0005 438/99 |
| 2016/0365368 A1* | 12/2016 | Kano ............... H01L 29/66969 |
| 2017/0098792 A1* | 4/2017 | Kim ................... H01L 51/0074 |
| 2018/0159001 A1 | 6/2018 | Schricker et al. |
| 2018/0323335 A1* | 11/2018 | Niroui ................ H01L 33/36 |
| 2020/0052232 A1* | 2/2020 | Daami ................ H01L 51/42 |
| 2020/0274086 A1* | 8/2020 | Sparrowe ........... H01L 51/0021 |
| 2021/0074938 A1* | 3/2021 | Hamoudi ................ C30B 7/14 |
| 2021/0119157 A1* | 4/2021 | Lowman ............... C08F 230/08 |
| 2021/0175220 A1* | 6/2021 | Feng ................... H01L 33/54 |

FOREIGN PATENT DOCUMENTS

| | | |
|---|---|---|
| KR | 10-2018-0073971 | 7/2018 |
| KR | 10-2019-0015165 | 2/2019 |

\* cited by examiner

DISPLAY DEVICE INCORPORATING SELF-ASSEMBLED MONOLAYER AND METHOD OF MANUFACTURING THE SAME

CROSS REFERENCE TO RELATED APPLICATION(S)

This application claims priority to and benefits of Korean Patent Application No. 10-2019-0128023 under 35 U.S.C. § 119, filed on Oct. 15, 2019 in the Korean Intellectual Property Office, the entire contents of which are incorporated herein by reference.

BACKGROUND

1. Technical Field

The disclosure relates to a display device and a method of manufacturing the same.

2. Description of the Related Art

A display device displays an image by using a light emitting element such as a light emitting diode (LED). The light emitting diode exhibits relatively excellent durability even in poor environmental conditions, and exhibits excellent performance in terms of lifespan and luminance.

Light emitting diodes may be attached onto a substrate by a chip bonding process or a solder reflow process that performs an assembly process by using a eutectic compound metal. In general, a process of coating a substrate by using a flux or the like is required to improve a bonding force between the light emitting diode and the substrate, but metal corrosion or out-gassing may occur due to residual flux, which may cause lighting defects in the display device.

SUMMARY

Disclosed are a display device and a method of manufacturing the same, which are capable of improving a bonding force between a light emitting diode and a substrate and preventing lighting defects.

A display device according to an embodiment may include pixels disposed on a substrate, a first electrode disposed on the substrate, an adhesive auxiliary layer disposed on the first electrode and including a self-assembled monolayer, a light emitting element disposed on the adhesive auxiliary layer, and a contact electrode disposed between the adhesive auxiliary layer and the light emitting element. The light emitting element may include a first semiconductor layer, a second semiconductor layer disposed on the first semiconductor layer, and an intermediate layer disposed between the first semiconductor layer and the second semiconductor layer.

The adhesive auxiliary layer may consist of the self-assembled monolayer.

A surface of the adhesive auxiliary layer may be in direct contact with the first electrode, and another surface of the adhesive auxiliary layer may be in direct contact with the contact electrode.

The adhesive auxiliary layer may cover an upper surface and a side surface of the first electrode.

The adhesive auxiliary layer may be continuously disposed to cover the first electrode in the pixels.

The adhesive auxiliary layer may include a siloxane compound.

The adhesive auxiliary layer may include a hydrophilic or hydrophobic functional group.

The adhesive auxiliary layer may form a silicon-oxygen (Si—O) bond with a surface of the first electrode.

The display device may further include an insulating layer disposed between the substrate and the first electrode, and the adhesive auxiliary layer may be in direct contact with the insulating layer.

The adhesive auxiliary layer may form a silicon-oxygen (Si—O) bond with a surface of the insulating layer.

The display device may further include a source electrode and a drain electrode disposed between the substrate and the insulating layer, and the first electrode may be electrically connected to the source electrode or the drain electrode through a contact hole passing through the insulating layer.

A surface of the contact electrode may be in direct contact with the adhesive auxiliary layer, and another surface of the contact electrode may be in direct contact with the first semiconductor layer.

The display device may further include a second electrode disposed on the first electrode, and the light emitting element may be disposed between the first electrode and the second electrode.

The first electrode may include at least one of copper (Cu) and gold (Au).

The light emitting element may be a micro light emitting diode having a side of which a length may be equal to or less than about 100 μm.

A method of manufacturing a display device according to an embodiment may include forming a first electrode on a substrate, forming a self-assembled monolayer on the first electrode, and attaching a micro light emitting diode on the self-assembled monolayer.

The method may further include forming a contact electrode on a surface of the micro light emitting diode, and the attaching of the micro light emitting diode may include attaching the contact electrode on the self-assembled monolayer to dispose the contact electrode between the micro light emitting diode and the self-assembled monolayer.

The forming of the self-assembled monolayer may include forming a self-assembled material layer on the first electrode, and chemisorbing the self-assembled material layer on a surface of the first electrode.

The forming of the self-assembled material layer may include at least one of dipping coating, spin coating, slit coating, inkjet printing, and vapor deposition.

The self-assembled material layer may include at least one of APS [(3-aminopropyl)trimethoxysilane], MUA (11-mercaptoundecanoic acid), DET [(3-trimethoxysilylpropyl)diethylenetriamine], EDA [N-(2-aminoethyl)-3-aminopropyl trimethoxysilane], PFS (perfluorodecyltrichlorosilane), OTS (octadecyltrichlorosilane), OTMS (octadecyltrimethoxysilane), HDT (1-hexadecanethiol), FDTS [(heptadecafluoro-1,1,2,2,-tetrahydrodecyl)trichlorosilane], FOTS (1H,1H,2H,2H-perfluorodecyltrichlorosilane-perfluorodecyltrichlorosilane), PFBT (pentafluorobenzenethiol), and DDMS (dichlorodimethylsilane).

The forming of the self-assembled monolayer may include forming a silicon-oxygen (Si—O) bond on a surface of the first electrode.

According to an embodiment of the disclosure, a bonding force between the light emitting diode and the substrate may be improved by forming the adhesive auxiliary layer on the first electrode of the substrate. Therefore, a flux coating process may be omitted so that the occurrence of lighting defects of the display device due to residual flux may be minimized.

Effects according to the embodiments are not limited to the above-mentioned explanation. Other various effects are also included in the disclosure.

BRIEF DESCRIPTION OF THE DRAWINGS

The above and other features of the disclosure will become more apparent by describing in detail the embodiments thereof with reference to the accompanying drawings, in which.

DETAILED DESCRIPTION OF THE EMBODIMENTS

Figure 1:
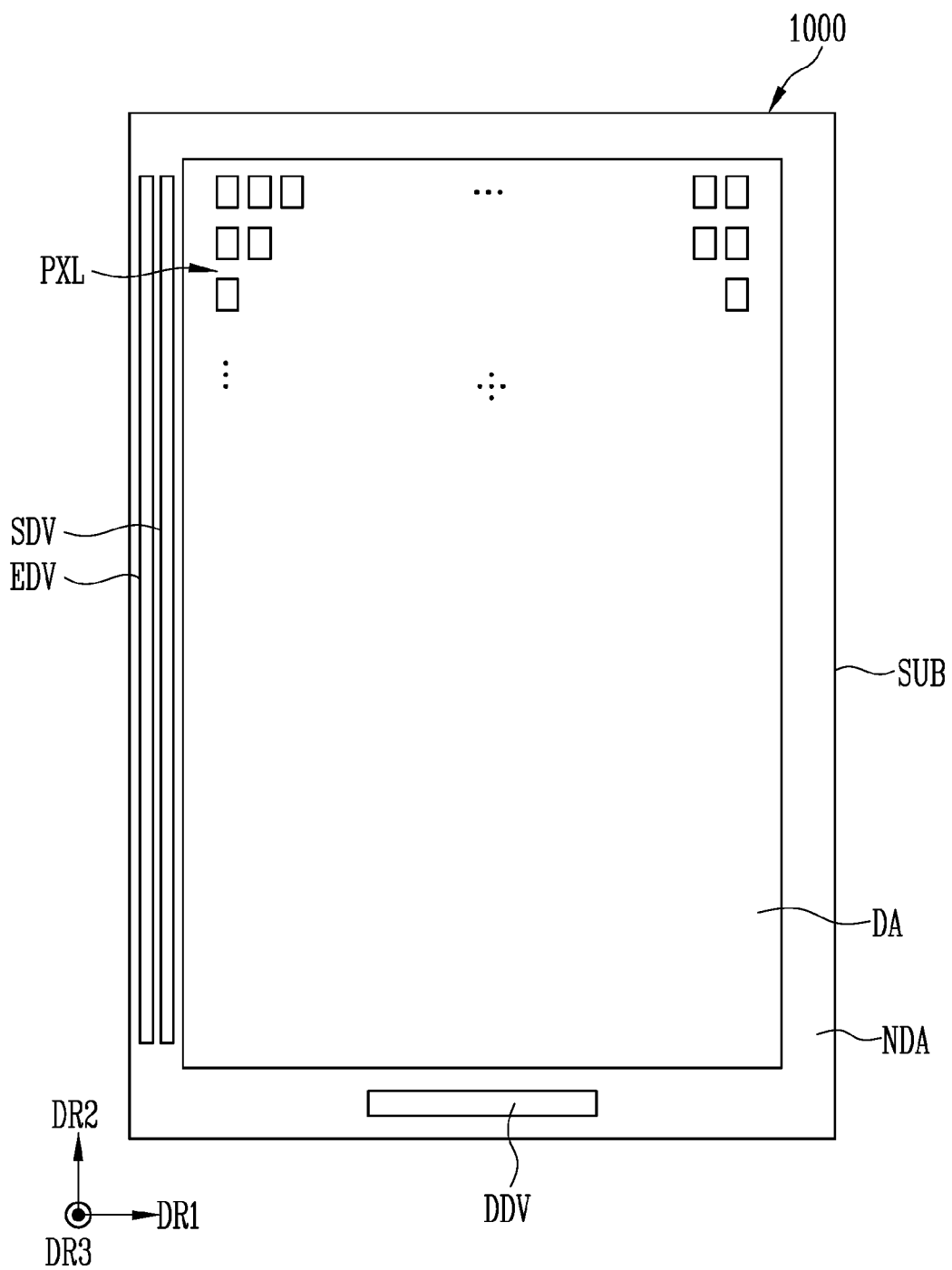
FIG. 1 is a schematic plan view schematically illustrating a display device according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and those skilled in the art to which the disclosure pertains can fully understand the scope of the disclosure. The disclosure is only defined by the scope of the claims.

When an element or a layer is described as "on" another element or layer, it can be "directly on" the other element or layer, or intervening elements or layers may also be present. It will also be understood that when an element or layer is described as being "under" or "below" another element or layer, it can be "directly under" the other element or layer, or intervening elements or layers may also be present. When an element or layer is referred to as being disposed "on" another element or layer, it can be disposed under the other element or layer.

The same reference numerals denote to the same components throughout the specification.

Although a first, a second, and the like are used to describe various components, it will be understood that these components are not limited by these terms. These terms are used only to distinguish one component from another component. Therefore, a first component mentioned below may be a second component within the technical spirit of the disclosure. The singular expressions include plural expressions unless the context clearly dictates otherwise.

It will be further understood that the terms "comprises," "comprising," "contains," "containing," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

Hereinafter, embodiments of the disclosure will be described in detail with reference to the accompanying drawings.

In the specification, a first direction DR1 indicates an X axis direction, a second direction DR2 indicates a Y axis direction, and a third direction DR3 indicates a Z axis direction.

FIG. 1 is a schematic plan view schematically illustrating a display device according to an embodiment.

Referring to FIG. 1, the display device 1000 may be applied to various electronic devices including small and medium-sized electronic devices such as a tablet PC, a smartphone, a car navigation unit, a camera, a center information display (CID) provided to a car, a wrist watch type electronic device, a personal digital assistant (PDA), a portable multimedia player, or a game machine, and a medium and large-sized electronic device such as a television, an external billboard, a monitor, a personal computer, or a notebook computer. These are merely presented as examples, and the display device 1000 may be employed in other electronic devices without departing from the concept of the disclosure.

A substrate SUB may have a planar rectangular shape. The substrate SUB may include short sides extending in one direction and long sides extending in another direction crossing the one direction. A corner portion where a long side and a short side of the substrate SUB meet may be a right angle on a plane (or in a plan view). But, the shape of the corner portion is not limited thereto, and may have a rounded curved shape. A planar shape of the substrate SUB is not limited to that illustrated, but may be embodied as a square, a circle, an ellipse, or other shapes.

The substrate SUB may include a display area DA displaying an image and a non-display area NDA that does not display an image.

The display area DA may be an area where pixels PXL are provided. The display area DA may be disposed on a front surface or a side surface of the substrate SUB, and a planar shape of the display area DA may follow the planar shape of the substrate SUB.

The non-display area NDA may be an area where drivers for driving the pixels PXL and various wiring portions (not shown) connecting the pixels PXL and the drivers are provided. The non-display area NDA may be disposed on at least one side of the display area DA. For example, the non-display area NDA may be disposed to surround the display area DA.

The pixels PXL may be provided in the display area DA on the substrate SUB. Each of the pixels PXL may emit one color of red, green, and blue, but is not limited thereto. For example, each of the pixels PXL may emit one color of cyan, magenta, yellow, and white.

The pixels PXL may be arranged in a matrix form while forming a row and a column along the first direction DR1 and the second direction DR2 crossing the first direction DR1. However, the arrangement of the pixels PXL is not limited to that shown in FIG. 1 and may be modified in various forms.

The driver may generate a driving signal required for driving the pixels PXL and provide the driving signal to the pixels PXL. The driver may include a scan driver SDV that provides a scan signal to the pixels PXL through a scan line, a light emission driver EDV that provides a light emission control signal to the pixels PXL through a light emission control line, a data driver DDV that provides a data signal to the pixels PXL through a data line, and a timing controller. The timing controller may control the scan driver SDV, the light emission driver EDV, and the data driver DDV. In FIG. 1, the scan driver SDV, the light emission driver EDV, and the data driver DDV are positioned in the non-display area NDA, but in another embodiment, the driver may be positioned outside the substrate SUB.

The pixels PXL may include at least one light emitting element driven by a corresponding scan signal and data signal. A detailed description of the light emitting element will be given later with reference to FIGS. 2 and 3.

Figure 2:
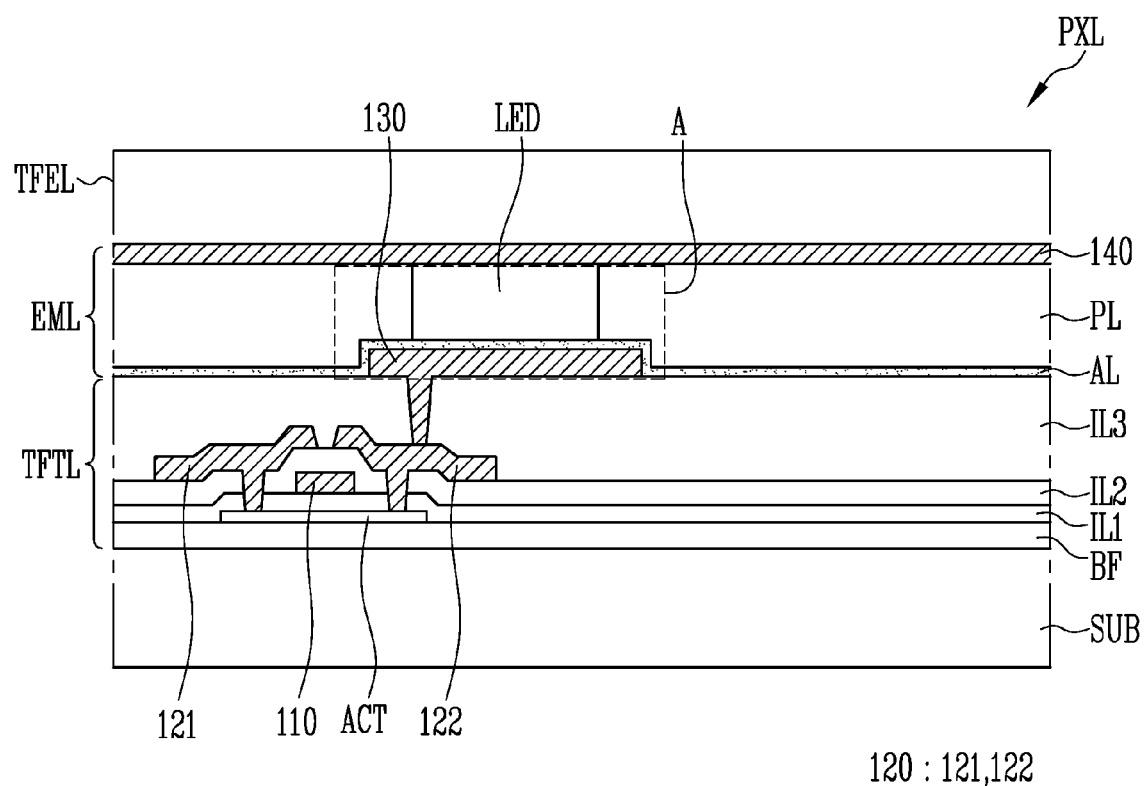
FIG. 2 is a schematic cross-sectional view illustrating a pixel according to an embodiment.
Figure 3:
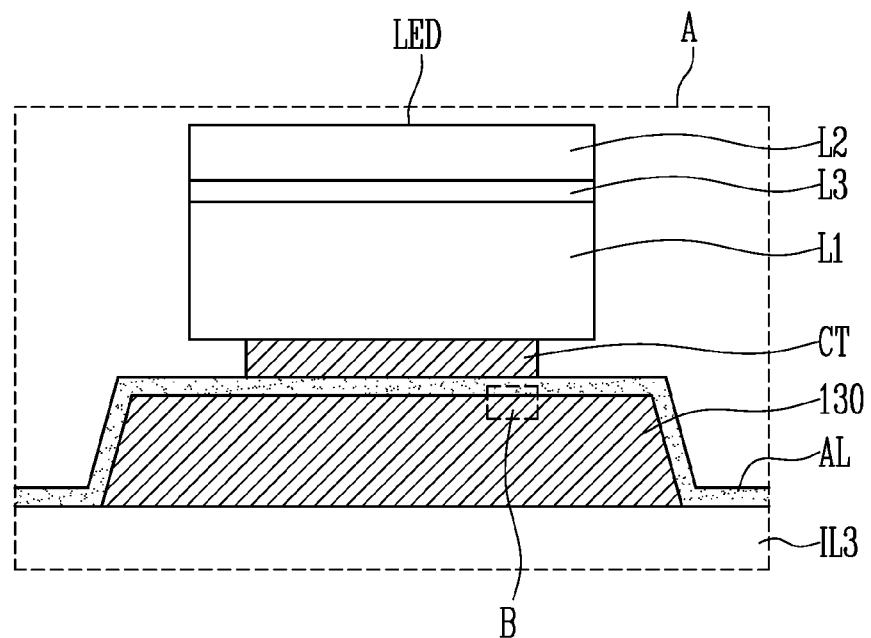
FIG. 3 is an enlarged view of region A of FIG. 2.

FIG. 2 is a schematic cross-sectional view illustrating the pixel according to an embodiment. FIG. 3 is an enlarged view of region A of FIG. 2.

Referring to FIGS. 2 and 3, the pixels PXL may include the substrate SUB, a thin film transistor layer TFTL, a light emitting element layer EML, and a thin film encapsulation layer TFEL.

The substrate SUB may be a flexible substrate that may be cured, bent, folded, or rolled. Examples of materials for flexible substrates may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The thin film transistor layer TFTL may be disposed on the substrate SUB. The thin film transistor layer TFTL may be disposed in the display area DA and the non-display area NDA.

The thin film transistor layer TFTL may include a buffer layer BF, an active layer ACT, a first insulating layer IL1, a first conductive layer 110, a second insulating layer IL2, a second conductive layer 120, and a third insulating layer IL3.

Each of the above-described layers may be formed of a single film, but may be formed of a stacked film including multiple films. Another layer may be further disposed between each of the layers.

The buffer layer BF may be disposed on the substrate SUB. The buffer layer BF may prevent diffusion of an impurity ion, prevent penetration of moisture, and perform a surface planarization function. The buffer layer BF may include silicon nitride, silicon oxide, silicon oxynitride, or the like.

The active layer ACT may be disposed on the buffer layer BF. The active layer ACT forms a channel of the thin film transistors of the pixels PXL. The active layer ACT may include polycrystalline silicon. The polycrystalline silicon may be formed by crystallizing amorphous silicon.

When the active layer ACT may be formed of the polycrystalline silicon, the ion-doped active layer ACT may have conductivity. Therefore, the active layer ACT may include a source region and a drain region as well as a channel region of the thin film transistors. The source region and the drain region may be connected to both sides of each channel region.

In another embodiment, the active layer ACT may include monocrystalline silicon, low temperature polycrystalline silicon, amorphous silicon, or an oxide semiconductor. The oxide semiconductor may include, for example, a binary system compound (ABx), a ternary system compound (ABxCy), or a quaternary system compound (ABxCyDz) containing indium, zinc, gallium, tin, titanium, aluminum, hafnium (Hf), zirconium (Zr), magnesium (Mg), or the like. In an embodiment, the active layer ACT may include ITZO (an oxide including indium, tin, and titanium) or IGZO (an oxide including indium, gallium, and tin).

The first insulating layer IL1 may be disposed on the active layer ACT. The first insulating layer IL1 may be disposed continuously over the surface (or the entire surface) of the substrate SUB. The first insulating layer IL1 may be a gate insulating film having a gate insulation function. The first insulating layer IL1 may include a silicon compound or a metal oxide. For example, the first insulating layer IL1 may include silicon oxide, silicon nitride, silicon oxynitride, aluminum oxide, tantalum oxide, hafnium oxide, zirconium oxide, titanium oxide, or the like. The first insulating layer IL1 may be a single film or a multi-layer film formed of stacked films of different materials.

The first conductive layer 110 may be disposed on the first insulating layer IL1. The first conductive layer 110 may include at least one metal selected from molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu). The first conductive layer 110 may be a single film or a multi-layer film. The first conductive layer 110 may include a gate electrode of the thin film transistors of the pixels PXL and a first electrode of a storage capacitor.

The second insulating layer IL2 may be disposed on the first conductive layer 110. The second insulating layer IL2 may be continuously disposed over the surface (or the entire surface) of the substrate SUB. The second insulating layer IL2 may serve to insulate the first conductive layer 110 and the second conductive layer 120.

The second insulating layer IL2 may include a same material as the above-described first insulating layer IL1 or may include at least one material selected from the materials exemplified as configuration materials of the first insulating layer IL1.

The second conductive layer 120 may be disposed on the second insulating layer IL2. The second conductive layer 120 may include a metal selected from aluminum (Al), molybdenum (Mo), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu). The second conductive layer 120 may be a single film or a multi-layer film. For example, the second conductive layer 120 may be formed of a stacked structure of Ti/Al/Ti, Mo/Al/Mo, Mo/AlGe/Mo, Ti/Cu, and the like.

The second conductive layer 120 may include a source electrode 121 and a drain electrode 122 of the thin film transistor. The source electrode 121 and the drain electrode 122 may be connected to the source region and the drain region of the active layer ACT through contact holes passing through the second insulating layer IL2 and the first insulating layer IL1, respectively.

The third insulating layer IL3 covers the second conductive layer 120. The third insulating layer IL3 may be a via layer. The third insulating layer IL3 may include an organic insulating material such as an acrylic resin (such as a polyacrylate resin), an epoxy resin, a phenolic resin, a polyamide resin, a polyimide resin, an unsaturated polyester resin, a poly phenylene ether resin, a polyphenylenesulfide resin, or benzocyclobutene (BCB).

The light emitting element layer EML may be disposed on the thin film transistor layer TFTL. The light emitting element layer EML may be disposed in the display area DA. However, the disclosure is not limited thereto, and the light emitting element layer EML may be disposed in the non-display area NDA.

The light emitting element layer EML may include a first electrode 130, an adhesive auxiliary layer AL, a light emitting element LED, and a second electrode 140.

The first electrode 130 may be disposed on the third insulating layer IL3. The first electrode 130 may have a stacked film structure of a material layer having a high work function such as copper (Cu), gold (Au), silver (Ag), magnesium (Mg), aluminum (Al), platinum (Pt), lead (Pb), nickel (Ni), neodium (Nd), iridium (Ir), chromium (Cr), lithium (Li), calcium (Ca), mixtures thereof, indium tin oxide (ITO), indium zinc oxide (IZO), zinc oxide (ZnO), indium oxide ($In_2O_3$), and combinations thereof. However, the disclosure is not limited thereto.

The first electrode 130 may be electrically connected to the thin film transistor. For example, the first electrode 130 may be electrically connected to the drain electrode 122 through a contact hole passing through the third insulating layer IL3. An anode electrode of the pixels PXL may be formed of the first electrode 130.

The adhesive auxiliary layer AL may be disposed on the first electrode 130. The adhesive auxiliary layer AL may be directly disposed on one surface of the first electrode 130. The adhesive auxiliary layer AL may be disposed to cover an upper surface and a side surface of the first electrode 130. For example, the adhesive auxiliary layer AL may be in contact (e.g. direct contact) with the upper surface and the side surface of the first electrode 130.

The adhesive auxiliary layer AL may be continuously disposed to cover the surface (or the entire surface) of the substrate SUB. The adhesive auxiliary layer may be continuously disposed to cover the first electrodes 130 of the pixels PXL. The adhesive auxiliary layer AL may be in contact (e.g. direct contact) with the third insulating layer IL3 disposed under the first electrode 130.

Figure 4:
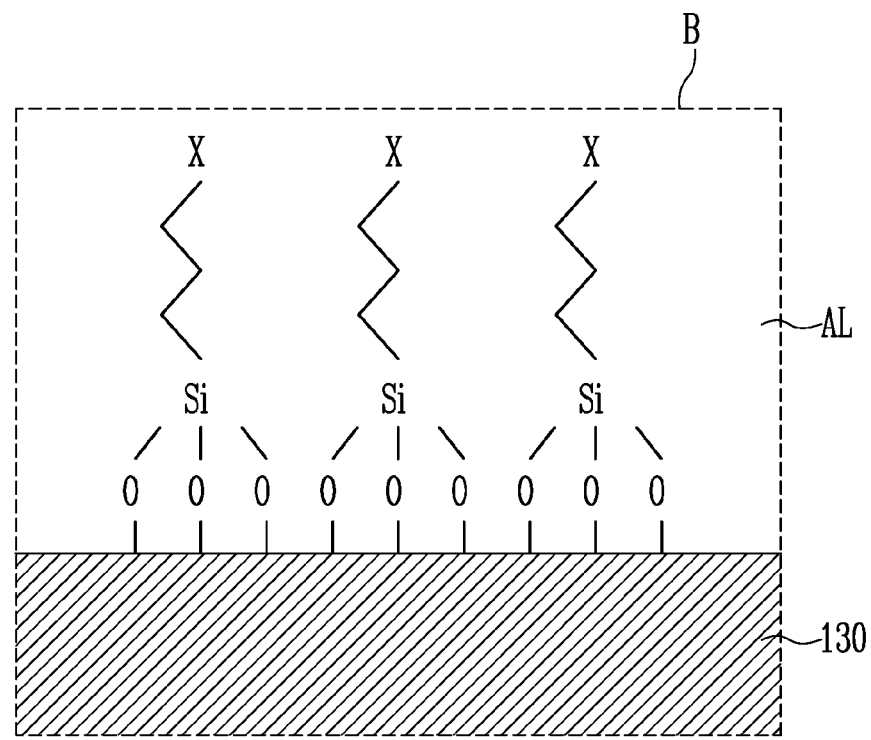
FIG. 4 is an enlarged view of region B of FIG. 3.

The adhesive auxiliary layer AL includes a self-assembled monolayer (SAM). In an embodiment, the adhesive auxiliary layer AL may consist of the self-assembled monolayer. For example, the adhesive auxiliary layer AL may be an organic monolayer spontaneously formed on a surface of the first electrode 130. The adhesive auxiliary layer AL may be regularly aligned on the surface of the first electrode 130. FIG. 4 refers to a detailed description thereof.

FIG. 4 is an enlarged view of region B of FIG. 3.

Referring to FIG. 4, the adhesive auxiliary layer AL may be chemisorbed on the surface of the first electrode 130. For example, the adhesive auxiliary layer AL may include a reactor of a head portion that may be coupled with the first electrode 130, an alkyl chain of a body portion that enables regular molecular film formation, and a functional group of a tail portion.

The reactor of the adhesive auxiliary layer AL may be chemisorbed on the surface of the first electrode 130. The reactor of the adhesive auxiliary layer AL may form a direct chemical bond with the surface of the first electrode 130.

For example, the adhesive auxiliary layer AL may include a siloxane compound as an alkylsiloxane self-assembled monolayer. The reactor of the adhesive auxiliary layer AL may form a silicon-oxygen (Si—O) bond with a surface of the first electrode 130. However, the disclosure is not limited thereto, and the adhesive auxiliary layer AL may include a phosphonate compound as an alkane phosphate self-assembled monolayer. The reactor of the adhesive auxiliary layer AL may form phosphorus-oxygen (P—O) bond with the surface of the first electrode 130.

The alkyl chain of the adhesive auxiliary layer AL may be formed of a substituted or un-substituted $C_1$-$C_{20}$ alkyl group. Due to Van der Waals interaction between the alkyl chains of the adhesive auxiliary layer AL, an aligned monolayer may be formed on the surface of the first electrode 130.

The functional group of the adhesive auxiliary layer AL may have a hydrophilic or hydrophobic functional group for controlling a surface characteristic of the first electrode 130.

For example, the adhesive auxiliary layer AL having the hydrophilic functional group may include, for example, APS [(3-aminopropyl)trimethoxysilane)], MUA (11-mercaptoundecanoic acid), DET [(3-trimethoxysilylpropyl)diethylenetriamine], EDA [N-(2-aminoethyl)-3-aminopropyl trimethoxysilane], and a combination thereof, but is not limited thereto.

The adhesive auxiliary layer AL having the hydrophobic functional group may include, for example, VTES (vinyltriethoxysilane), GPTMS (3-glycidoxypropyltrimethoxysilane), MPTMS (3-methacryloxypropyltrimethoxysilane), PFS (perfluorodecyltrichlorosilane), OTS (octadecyltrichlorosilane), OTMS (octadecyltrimethoxysilane), HDT (1-hexadecanethiol), FDTS [(heptadecafluoro-1,1,2,2,-tetrahydrodecyl)trichlorosilane], FOTS (1H,1H,2H,2H-perfluorodecyltrichlorosilane-perfluorodecyltrichlorosilane), PFBT (pentafluorobenzenethiol), DDMS (dichlorodimethylsilane), and a combination thereof, but is not limited thereto.

As described above, when the adhesive auxiliary layer AL is adsorbed (e.g. chemisorbed) on the surface of the first electrode 130 to form the self-assembled monolayer, the surface characteristic of the first electrode 130 may be easily controlled. Therefore, the surface of the first electrode 130 may be prevented from being oxidized, lubricity and the wettability may be improved, and a bonding force between the first electrode 130 and the light emitting element LED that will be described later may be improved.

FIG. 4 illustrates only an example where the adhesive auxiliary layer AL is adsorbed (e.g. chemisorbed) on the surface of the first electrode 130. However, similarly, the adhesive auxiliary layer AL may form a direct chemical bond with a surface of the third insulating layer IL3. However, embodiments are not limited thereto.

For example, when the adhesive auxiliary layer AL is the alkylsiloxane self-assembled monolayer, the reactor of the adhesive auxiliary layer AL may form a silicon-oxygen (Si—O) bond with the surface of the third insulating layer IL3.

When the adhesive auxiliary layer AL is the alkane phosphate self-assembled monolayer, the reactor of the adhesive auxiliary layer AL may form a phosphorus-oxygen (P—O) bond with the surface of the third insulating layer IL3. Since the details of the adhesive auxiliary layer AL have been described with reference to FIG. 4, a repetitive description thereof is omitted.

The light emitting element LED and a planarization layer PL may be disposed on the first electrode 130.

Referring to FIG. 3, the light emitting element LED may include a first semiconductor layer L1, a second semiconductor layer L2, and an intermediate layer L3. The intermediate layer L3 may be disposed between the first semiconductor layer L1 and the second semiconductor layer L2. Hereinafter, the light emitting element LED will be described based on an example of a vertical light emitting diode in which the first semiconductor layer L1, the intermediate layer L3, and the second semiconductor layer L2 may be sequentially stacked. However, embodiments are not limited thereto.

For example, the first semiconductor layer L1 may be formed by including an n-type semiconductor layer. The n-type semiconductor layer may be selected from a semiconductor material having a composition formula of $In_xAl_yGa_{(1-x-y)}N$ (0≤x≤1, 0≤y≤1, 0≤x+y≤1), for example, GaN, AlN, AlGaN, InGaN, InN, InAlGaN, AlInN, and the like, and an n-type dopant such as Si, Ge, or Sn may be doped.

For example, the second semiconductor layer L2 may be implemented with a p-type semiconductor layer. The p-type semiconductor layer may be selected from a semiconductor material having a composition formula of $In_xAl_yGa_{(1-x-y)}N$ (0≤x≤1, 0≤y≤1, 0≤x+y≤1), for example, GaN, AlN, AlGaN, InGaN, InN, InAlGaN, AlInN, and the like, and a p-type dopant such as Mg, Zn, Ca, Sr, and Ba may be doped.

However, the disclosure is not limited thereto, and the first semiconductor layer L1 may include a p-type semiconductor layer, and the second semiconductor layer L2 may include an n-type semiconductor layer.

The intermediate layer L3 may be a region where an electron and a hole are recombined. The intermediate layer L3 transits to a low energy level as the electron and the hole recombine, and may generate light having a corresponding wavelength. For example, the intermediate layer L3 may be formed by including a semiconductor material having a composition formula of $In_xAl_yGa_{(1-x-y)}N$ (0≤x≤1, 0≤y≤1, 0≤x+y≤1).

FIG. 3 illustrates an embodiment where the intermediate layer L3 is configured of a single quantum structure, but is not limited thereto. For example, the intermediate layer L3 may be a multi quantum well structure (MQW). The intermediate layer L3 may be formed of a multi-layer structure in which the active layer and the insulating layer are alternately stacked, and the active layer and the insulating layer may have a same thickness. However, the disclosure is not limited thereto, and the intermediate layer L3 may be an asymmetric quantum well structure (AQW) in which the active layer and the insulating layer have different thicknesses.

In an embodiment, the light emitting element LED may be a micro light emitting diode (micro LED) having a size of a micrometer (μm) unit. For example, a length of one side of the light emitting element LED may be less than or equal to about 100 μm, but is not limited thereto.

The light emitting element LED may be electrically connected to the thin film transistor through the first electrode 130. A contact electrode CT may be further disposed between the light emitting element LED and the first electrode 130.

The contact electrode CT may be disposed between the adhesive auxiliary layer AL including the self-assembled monolayer and the first semiconductor layer L1 of the light emitting element LED. A surface of the contact electrode CT may be in contact (e.g. direct contact) with the adhesive auxiliary layer AL, and another surface of the contact electrode CT may be in contact (e.g. direct contact) with the first semiconductor layer L1.

As described above, corrosion resistance, lubricity, and wettability of the first electrode 130 may be improved by the adhesive auxiliary layer AL. Therefore, since the contact electrode CT may be easily attached on the first electrode 130, the bonding force between the first electrode 130 and the light emitting element LED may be improved as described above.

The contact electrode CT may include a metal or a metal oxide. For example, the contact electrode CT may include chromium (Cr), titanium (Ti), aluminum (Al), gold (Au), nickel (Ni), indium tin oxide (ITO), an oxide thereof, an alloy thereof, and the like, but is not limited thereto.

The planarization layer PL may be disposed to surround the light emitting element LED. The planarization layer PL may serve to prevent a step difference due to the light emitting element LED.

The planarization layer PL may include an organic insulating material such as an acrylic resin (e.g. a polyacrylate resin), an epoxy resin, a phenolic resin, a polyamide resin, a polyimide resin, an unsaturated polyester resin, a poly phenylene ether resin, a polyphenylenesulfide resin, or benzocyclobutene (BCB).

The second electrode 140 may be disposed on the light emitting element LED and the planarization layer PL. The second electrode 140 may be continuously disposed on the light emitting element LED and the planarization layer PL.

The second electrode 140 may be formed of a metal thin film having a small work function such as Li, Ca, LiF/Ca, LiF/Al, Al, Mg, Ag, Pt, Pd, Ni, Au Nd, Ir, Cr, BaF, Ba, or a compound thereof, or a mixture thereof (for example, a mixture of Ag and Mg, and the like). The second electrode 140 may further include a transparent metal oxide layer disposed on the material layer having the small work function. Therefore, the second electrode 140 may transmit light emitted from the light emitting element LED. A cathode electrode of the pixels PXL may be formed of the second electrode 140.

The thin film encapsulation layer TFEL may be disposed on the light emitting element layer EML. The thin film encapsulation layer TFEL serves to prevent oxygen or moisture from penetrating into the light emitting element layer EML. To this end, the thin film encapsulation layer TFEL may include at least one inorganic film. The inorganic film may include a silicon nitride layer, a silicon oxy nitride layer, a silicon oxide layer, a titanium oxide layer, or an aluminum oxide layer, but is not limited thereto.

The thin film encapsulation layer TFEL serves to protect the light emitting element layer EML from a foreign substance such as dust. To this end, the thin film encapsulation layer TFEL may include at least one organic film. The organic film may include an acrylic resin, an epoxy resin, a phenolic resin, a polyamide resin, or a polyimide resin, but is not limited thereto.

For example, the thin film encapsulation layer TFEL may have a structure in which an inorganic film, an organic film, and an inorganic film are sequentially stacked. The inorganic film may prevent oxygen or moisture from penetrating into the light emitting element layer EML. The organic film may prevent propagation of a crack generated in the inorganic film.

The thin film encapsulation layer TFEL may be disposed in both of the display area DA and the non-display area NDA. For example, the thin film encapsulation layer TFEL may be disposed to cover the light emitting element layer EML of the display area DA and the non-display area NDA and cover the thin film transistor layer TFTL of the non-display area NDA.

As described above, when the adhesive auxiliary layer AL is adsorbed (e.g. chemisorbed) on the surface of the first electrode 130, the surface characteristic of the first electrode 130 may be easily controlled. Therefore, since the surface of the first electrode 130 may be prevented from being oxidized and the lubricity and the wettability may be improved, the bonding force between the first electrode 130 and the light emitting element LED may be improved as described above.

Hereinafter, another embodiment will be described. In the following embodiment, the same configuration as the already described configuration will be denoted by the same reference numerals, and a repetitive description will be omitted or simplified.

Figure 5:
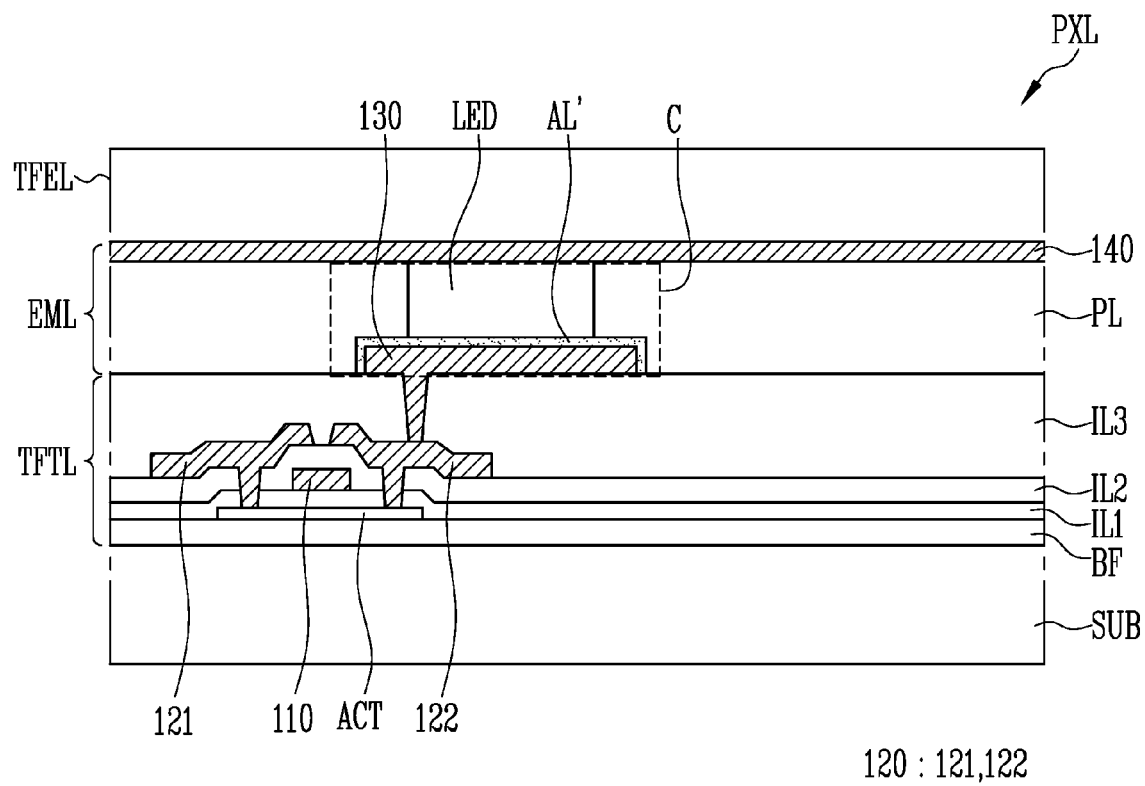
FIG. 5 is a schematic cross-sectional view illustrating a pixel according to another embodiment.
Figure 6:
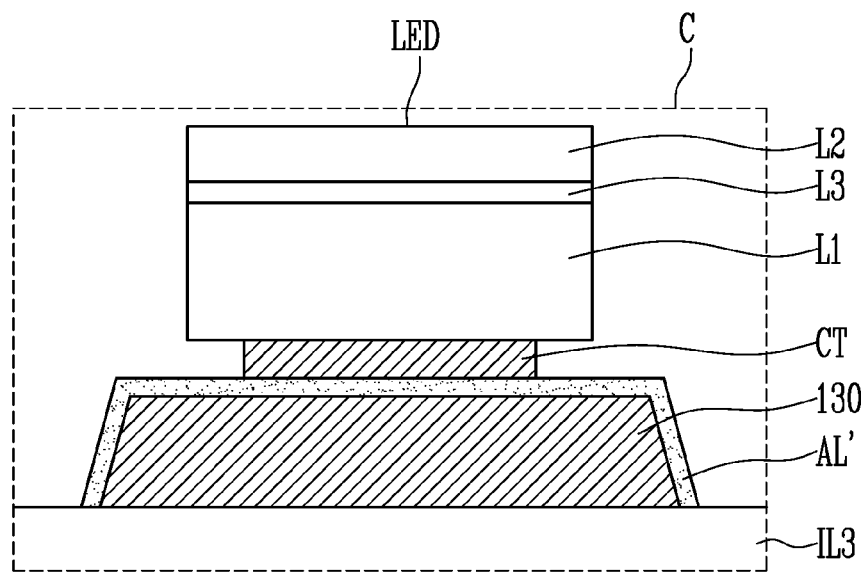
FIG. 6 is an enlarged view of region C of FIG. 5.

FIG. 5 is a schematic cross-sectional view illustrating the pixel according to another embodiment. FIG. 6 is an enlarged view of region C of FIG. 5.

Referring to FIGS. 5 and 6, the display device according to the embodiment is different from the embodiment of FIGS. 1 to 4 in that an adhesive auxiliary layer AL' is partially disposed on the first electrode 130.

For example, the adhesive auxiliary layer AL' may be directly disposed on one surface of the first electrode 130. The adhesive auxiliary layer AL' may be disposed to cover the upper surface and the side surface of the first electrode 130. For example, the adhesive auxiliary layer AL' may be in contact (e.g. direct contact) with the upper surface and the side surface of the first electrode 130.

The adhesive auxiliary layer AL' may be a self-assembled monolayer and may be adsorbed (e.g. chemisorbed) on the surface of the first electrode 130 to form a direct chemical bond with the surface of the first electrode 130. The bonding force between the first electrode 130 and the light emitting element LED may be improved by controlling the surface characteristic of the first electrode 130 as described above. A detailed description thereof has been described with reference to FIGS. 1 to 4, and thus a repetitive description is omitted.

The adhesive auxiliary layer AL' may be partially disposed only on the surface of the first electrode 130, and may not be disposed on the third insulating layer IL3. The planarization layer PL may be directly disposed on the third insulating layer IL3. For example, the third insulating layer IL3 may be in contact (e.g. direct contact) with the planarization layer PL.

Since the thin film transistor layer TFTL, the light emitting element LED, and the thin film encapsulation layer TFEL have been described with reference to FIGS. 1 to 4, a repetitive description thereof is omitted.

Subsequently, a method of manufacturing the display device according to the embodiment described above will be described. Among the display devices according to various embodiments, a method of manufacturing the display device of FIGS. 1 to 4 will be described as an example. Components substantially the same as those in FIGS. 1 to 4 are denoted by the same reference numerals, and detailed reference numerals are omitted.

FIGS. 7 to 11 are schematic cross-sectional views illustrating process steps of the method of manufacturing the display device according to an embodiment.

Figure 7:
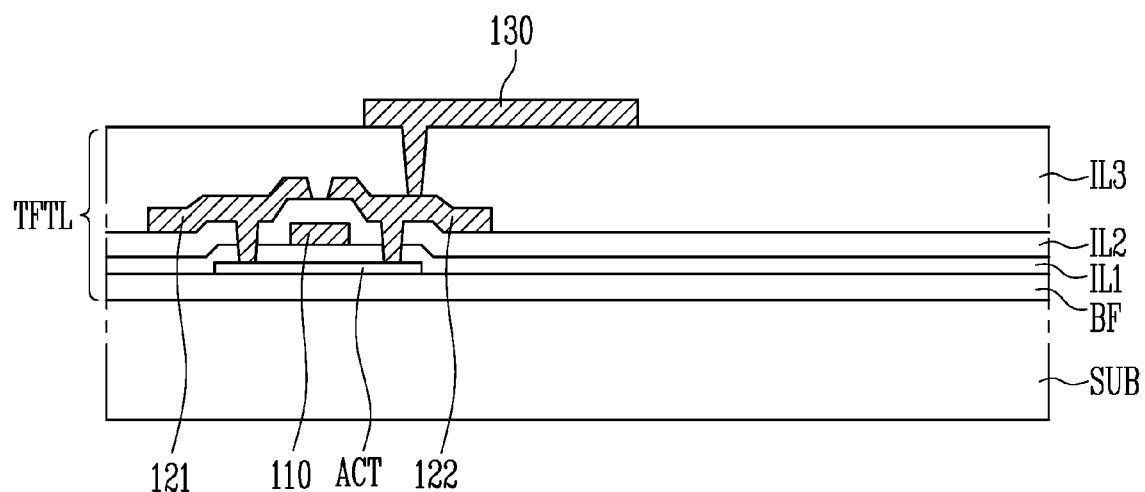
FIGS. 7 to 11 are schematic cross-sectional views illustrating process steps of a method of manufacturing the display device according to an embodiment.

Referring to FIG. 7, the substrate SUB is prepared, and the thin film transistor layer TFTL and the first electrode 130 may be formed on the substrate SUB. Since the thin film transistor layer TFTL and the first electrode 130 have been described with reference to FIGS. 1 to 4, a repetitive description thereof is omitted.

Figure 8:
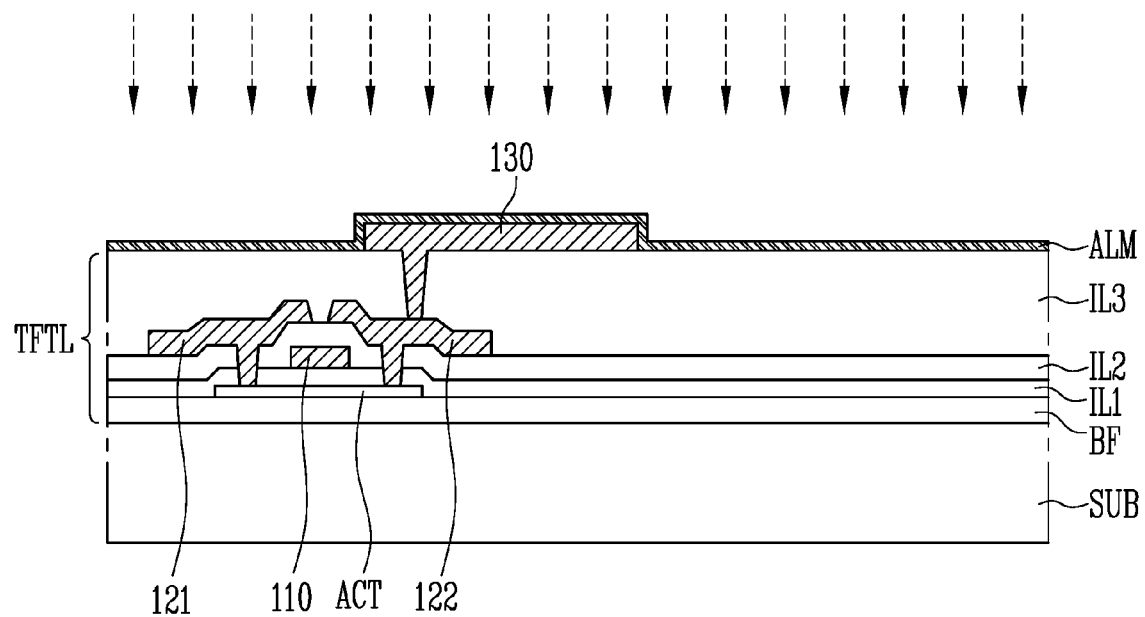

Referring to FIG. 8, a self-assembled material layer ALM is formed over the surface (or the entire surface) of the substrate SUB.

As described above, the self-assembled material layer ALM may include a siloxane compound. For example, the self-assembled material layer ALM may include at least one material among APS [(3-aminopropyl)trimethoxysilane)], MUA (11-mercaptoundecanoic acid), DET [(3-trimethoxysilylpropyl)diethylenetriamine], EDA [N-(2-aminoethyl)-3-aminopropyl trimethoxysilane], VTES (vinyltriethoxysilane), GPTMS (3-glycidoxypropyltrimethoxysilane), MPTMS (3-methacryloxypropyltrimethoxysilane), PFS (perfluorodecyltrichlorosilane), OTS (octadecyltrichlorosilane), OTMS (octadecyltrimethoxysilane), HDT (1-hexadecanethiol), FDTS [(heptadecafluoro-1,1,2,2,-tetrahydrodecyl)trichlorosilane], FOTS (1H,1H,2H,2H-perfluorodecyltrichlorosilane-perfluorodecyltrichlorosilane), PFBT (pentafluorobenzenethiol), and DDMS (dichlorodimethylsilane).

The forming of the self-assembled material layer ALM may include liquid or vapor deposition of self-assembled material.

The forming of the self-assembled material layer ALM may include at least one method of dipping coating, spin coating, slit coating, inkjet printing, and vapor deposition of self-assembled material, but is not limited thereto.

Figure 9:
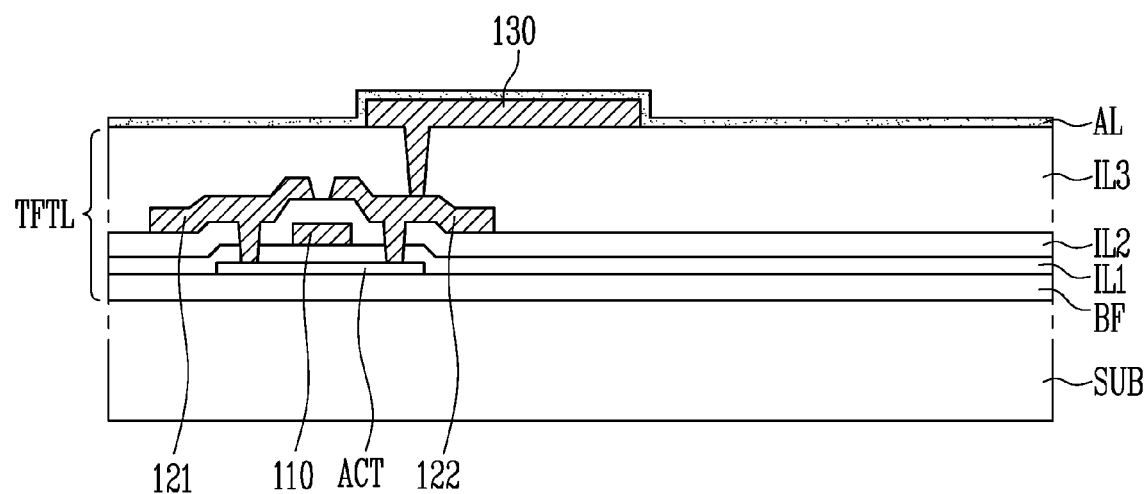

Referring to FIG. 9, the self-assembled material layer ALM is chemisorbed on the surface of the first electrode 130 to form the adhesive auxiliary layer AL. As described above, the adhesive auxiliary layer AL may consist of the self-assembled monolayer. For example, the adhesive auxiliary layer AL may be the organic monolayer formed spontaneously on the surface of the first electrode 130. The reactor of the adhesive auxiliary layer AL may form a direct chemical bond with the surface of the first electrode 130. A configuration molecule of the adhesive auxiliary layer AL may be adsorbed (e.g. chemisorbed) on the surface of the first electrode 130 and forms a supramolecular assembly according to an interaction of molecules at the same time, and thus the surface of the first electrode 130 may be prevented from being oxidized, and the lubricity and the wettability may be improved. Thus, the bonding force between the first electrode 130 and the light emitting element LED may be improved as described above.

Figure 10:
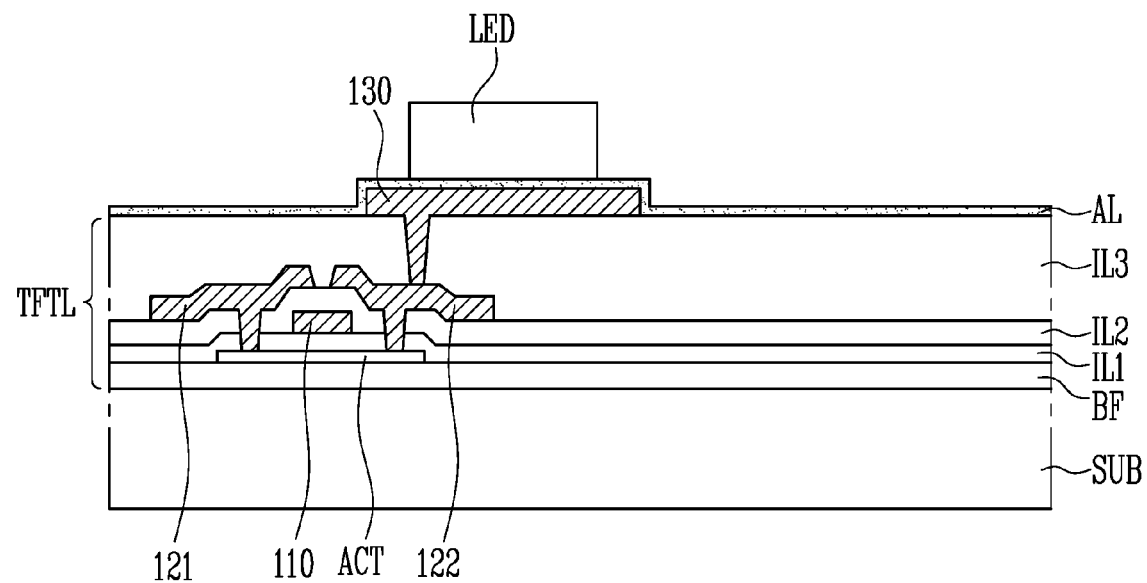

Referring to FIG. 10, the light emitting element LED is attached on the substrate SUB. For example, the substrate SUB and the light emitting element LED may be coupled to each other by attaching the light emitting element LED to the first electrode 130 on which the adhesive auxiliary layer AL is formed. As described above, the light emitting element LED may be a micro light emitting diode and may further include the contact electrode disposed on one surface of the first semiconductor layer L1. The attaching of the light emitting element LED may include attaching the contact electrode on the self-assembled monolayer of the adhesive auxiliary layer to dispose the contact electrode between the light emitting element LED and the self-assembled monolayer. Since the contact electrode has been described in detail with reference to FIGS. 1 to 4, a repetitive description thereof is omitted.

Figure 11:
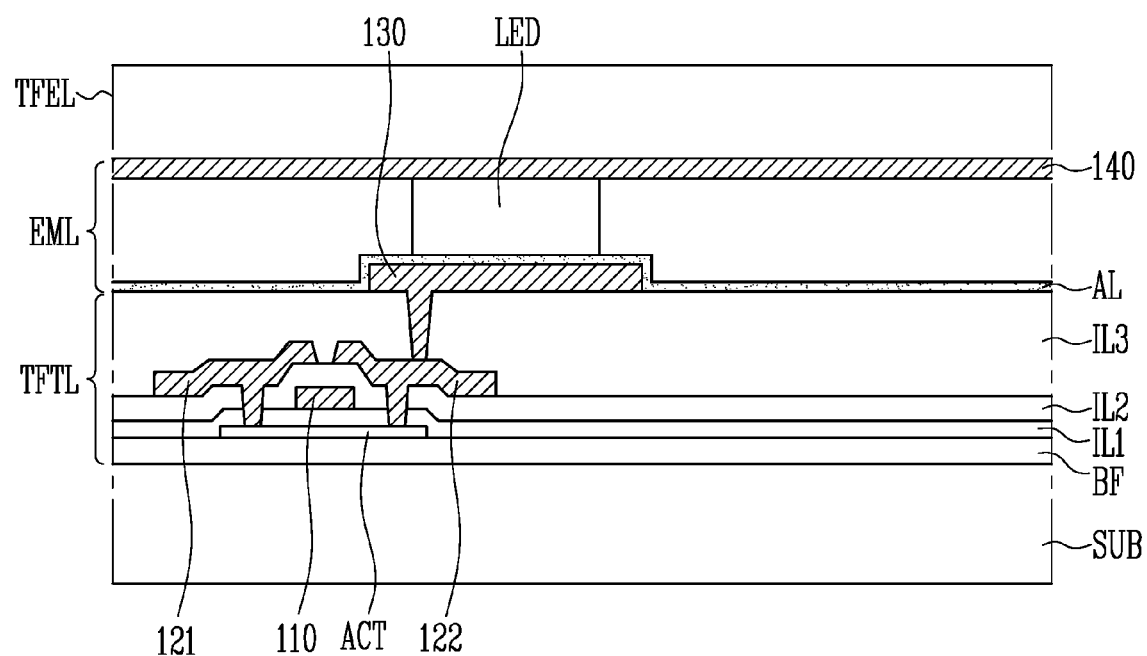

Referring to FIG. 11, the second electrode 140 and the thin film encapsulation layer TFEL are formed on the light emitting element LED.

The second electrode 140 may be continuously formed by depositing a material for the second electrode on the light emitting element LED and the planarization layer PL. The material for the second electrode may include a material having a low work function for electron injection, for example, Li, Ca, LiF/Ca, LiF/Al, Al, Mg, Ag, Pt, Pd, Ni, Au Nd, Ir, Cr, BaF, Ba, or a compound thereof, or a mixture thereof (for example, a mixture of Ag and Mg, and the like). The material for the second electrode may further include a transparent conductive oxide such as indium tin oxide (ITO), indium zinc oxide (IZO), indium tin zinc oxide (ITZO), zinc oxide, or tin oxide.

The thin film encapsulation layer TFEL may be formed on the second electrode 140 to complete the display device as shown in FIG. 2.

According to the method of manufacturing the display device according to the above-described embodiment, the bonding force between the light emitting element LED and the substrate SUB may be improved by forming the adhesive auxiliary layer AL on the first electrode 130 of the substrate SUB by using a self-assembly material.

Since a flux coating process, which has been required for improving the bonding force, may be omitted, metal corrosion or out-gassing due to residual flux may be minimized. For example, the bonding force between the light emitting element LED and the substrate SUB may be improved and lighting defects of the display device may be minimized.

Those skilled in the art may understand that the disclosure may be implemented in a modified form without departing from the above-described essential characteristic. Therefore, the disclosed methods should be considered in a description point of view not a limitation point of view. The scope of the disclosure is shown in the claims not in the above description, and all differences within the scope will be construed as being included in the disclosure.

What is claimed is:

1. A display device comprising:
   a plurality of pixels disposed on a substrate;
   a first electrode disposed on the substrate;
   an adhesive auxiliary layer disposed on the first electrode and including a self-assembled monolayer;
   a light emitting element disposed on the adhesive auxiliary layer, the light emitting element including:
      a first semiconductor layer;
      a second semiconductor layer disposed on the first semiconductor layer;
      and
      an intermediate layer disposed between the first semiconductor layer and the second semiconductor layer; and
   a contact electrode disposed between the adhesive auxiliary layer and the light emitting element.

2. The display device according to claim 1, wherein the adhesive auxiliary layer consists of the self-assembled monolayer.

3. The display device according to claim 1, wherein
   a surface of the adhesive auxiliary layer is in direct contact with the first electrode, and
   another surface of the adhesive auxiliary layer is in direct contact with the contact electrode.

4. The display device according to claim 1, wherein the adhesive auxiliary layer covers an upper surface and a side surface of the first electrode.

5. The display device according to claim 4, wherein the adhesive auxiliary layer is continuously disposed to cover the first electrode in the plurality of pixels.

6. The display device according to claim 1, wherein the adhesive auxiliary layer includes a siloxane compound.

7. The display device according to claim 6, wherein the adhesive auxiliary layer includes a hydrophilic or hydrophobic functional group.

8. The display device according to claim 5, wherein the adhesive auxiliary layer forms a silicon-oxygen (Si—O) bond with a surface of the first electrode.

9. The display device according to claim 1, further comprising:
   an insulating layer disposed between the substrate and the first electrode,
   wherein the adhesive auxiliary layer is in direct contact with the insulating layer.

10. The display device according to claim 9, wherein the adhesive auxiliary layer forms a silicon-oxygen (Si—O) bond with a surface of the insulating layer.

11. The display device according to claim 9, further comprising:
    a source electrode and a drain electrode disposed between the substrate and the insulating layer,
    wherein the first electrode is electrically connected to the source electrode or the drain electrode through a contact hole passing through the insulating layer.

12. The display device according to claim 1, wherein
    a surface of the contact electrode is in direct contact with the adhesive auxiliary layer, and
    another surface of the contact electrode is in direct contact with the first semiconductor layer.

13. The display device according to claim 1, further comprising:
    a second electrode disposed on the first electrode,
    wherein the light emitting element is disposed between the first electrode and the second electrode.

14. The display device according to claim 13, wherein the first electrode includes at least one of copper (Cu) and gold (Au).

15. The display device according to claim 1, wherein the light emitting element is a micro light emitting diode having a side of which a length is equal to or less than about 100 µm.

16. A method of manufacturing a display device, the method comprising:
    forming a first electrode on a substrate;
    forming a self-assembled monolayer on the first electrode; and
    attaching a micro light emitting diode on the self-assembled monolayer such that the micro light emitting diode makes electrical contact with the first electrode via a top surface of the self-assembled monolayer.

17. The method according to claim 16, further comprising:
    forming a contact electrode on a surface of the micro light emitting diode,
    wherein the attaching of the micro light emitting diode includes attaching the contact electrode on the self-assembled monolayer to dispose the contact electrode between the micro light emitting diode and the self-assembled monolayer.

18. The method according to claim 16, wherein the micro light emitting diode directly contacts the top surface of the self-assembled monolayer.

19. The method according to claim 16, further comprising:
    a contact electrode between the micro light emitting diode and the electrode, the contact electrode being directly disposed on the top surface of the self-assembled monolayer.

20. A method of manufacturing a display device, the method comprising:
    forming a first electrode on a substrate;
    forming a self-assembled monolayer on the first electrode; and
    attaching a micro light emitting diode on the self-assembled monolayer, wherein the forming of the self-assembled monolayer comprises:
    forming a self-assembled material layer on the first electrode; and chemisorbing the self-assembled material layer on a surface of the first electrode.

21. The method according to claim 20, wherein the forming of the self-assembled material layer includes at least one of dipping coating, spin coating, slit coating, inkjet printing, and vapor deposition.

22. The method according to claim 21, wherein the self-assembled material layer includes at least one of APS [(3-aminopropyl)trimethoxysilane], MUA(11-mercaptoundecanoic acid), DET[(3-trimethoxysilylpropyl)diethylenetriamine], EDA[N-(2-aminoethyl)-3-aminopropyl trimethoxysilane], PFS(perfluorodecyltrichlorosilane), OTS (octadecyltrichlorosilane), OTMS(octadecyltrimethoxysilane), HDT(1-hexadecanethiol), FDTS[(heptadecafluoro-1,1,2,2,-tetrahydrodecyl)trichlorosilane], FOTS(1H,1H,2H,2H-perfluorodecyltrichlorosilane-perfluorodecyltrichlorosilane), PFBT (pentafluorobenzenethiol), and DDMS (dichlorodimethylsilane).

23. A method of manufacturing a display device, the method comprising:
    forming a first electrode on a substrate;
    forming assembled monolayer on the first electrode, wherein the forming of the self-assembled monolayer comprises forming a silicon-oxygen (Si—O) bond on a surface of the first electrode; and
    attaching a micro light emitting diode on the self-assembled monolayer.

* * * * *